(12) United States Patent
Ahiko et al.

(10) Patent No.: US 10,906,403 B2
(45) Date of Patent: Feb. 2, 2021

(54) COLLECTED CURRENT MONITORING DEVICE

(71) Applicant: Central Japan Railway Company, Nagoya (JP)

(72) Inventors: Yuichi Ahiko, Nagoya (JP); Kotaro Nakamura, Nagoya (JP); Hiroki Shimoyama, Nagoya (JP)

(73) Assignee: Central Japan Railway Company, Nagoya (JP)

( * ) Notice: Subject to any disclaimer, the term of this patent is extended or adjusted under 35 U.S.C. 154(b) by 0 days.

(21) Appl. No.: 16/665,306

(22) Filed: Oct. 28, 2019

(65) Prior Publication Data
US 2020/0141985 A1 May 7, 2020

(30) Foreign Application Priority Data
Nov. 5, 2018 (JP) .................................. 2018-208171

(51) Int. Cl.
*B60L 5/00* (2006.01)
*B61C 3/02* (2006.01)
*G01R 19/25* (2006.01)

(52) U.S. Cl.
CPC ................ *B60L 5/00* (2013.01); *B61C 3/02* (2013.01); *G01R 19/2513* (2013.01)

(58) Field of Classification Search
CPC ... B60L 13/00; B60L 5/00; B60L 5/24; G01R 19/2513; B61C 3/02
See application file for complete search history.

(56) References Cited

U.S. PATENT DOCUMENTS

2012/0090499 A1* 4/2012 Shimada .................. B60L 9/28
105/49
2019/0092172 A1 3/2019 Ahiko et al.

FOREIGN PATENT DOCUMENTS

JP 2017158287 A 9/2019

* cited by examiner

*Primary Examiner* — Carlos Amaya
(74) *Attorney, Agent, or Firm* — Wiggin and Dana LLP; Gregory S. Rosenblatt; Thomas M. Landman

(57) ABSTRACT

Provided is a collected current monitoring device enabling an analysis of collected current in each current collector while allowing a reduced equipment cost. The collected current monitoring device of the present disclosure is installed in a railroad vehicle including current collectors, main transformers, and main converters. The collected current monitoring device includes: a supply current sensor configured to measure a current supplied to a freely-selected one of the main transformers, at least one current-sensor-between-current-collectors disposed in each communication path connecting two adjacent ones of the current collectors and configured to measure a current flowing in the communication path, and a processor configured to calculate a current flowing in each of the current collectors based on the current measured by the supply current sensor and the current measured by the at least one current-sensor-between-current-collectors, and on a distribution ratio of the currents supplied to the main transformers.

3 Claims, 5 Drawing Sheets

COLLECTED CURRENT MONITORING DEVICE

CROSS-REFERENCE TO RELATED APPLICATIONS

The present application claims the benefit of Japanese Patent Application No. 2018-208171 filed on Nov. 5, 2018 with the Japan Patent Office, the entire disclosure of which is incorporated herein by reference.

BACKGROUND

The present disclosure relates to a collected current monitoring device.

A railroad vehicle is equipped with current collectors to receive electric current from overhead contact lines. The current collectors supply current to main transformers connected in parallel to one another. The main transformers supply currents to respective main converters to which the main transformers themselves are connected.

Stable operation of railroad vehicles requires monitoring of the collected current flowing in each current collector. In a conventional monitoring device, a current sensor is disposed in each of current paths branched from each of the current collectors toward the respective main transformers, and measured values by the current sensors are used to analyze the collected current in each of the current collectors (see Japanese Unexamined Patent Application Publication No. 2017-158287).

SUMMARY

In a conventional monitoring device as shown in FIG. 5, it is required to provide current sensors 103A, 103B, 103C, and 103D individually in current paths branched from current collectors 111 and 112. In other words, when a railroad vehicle comprises current paths branched from at least one current collector 111 toward main transformers 121 and 122 as illustrated in FIG. 5, N (N is a positive integer) current collectors require at least 2N current sensors. It is also required to provide analyzers 104A and 104B for analysis of the collected current in each current collector. Therefore, as the number of current collectors increases, the equipment costs for monitoring device(s) increase.

In one aspect of the present disclosure, it is preferable to provide a collected current monitoring device that enables analysis of collected current in each current collector with less equipment cost.

One embodiment of the present disclosure is a collected current monitoring device installed in a railroad vehicle comprising current collectors, main transformers connected in parallel to one another and supplied with currents from the current collectors, and main converters supplied with currents from the main transformers. The collected current monitoring device comprises a supply current sensor configured to measure a current supplied to a freely-selected main transformer among the main transformers, at least one current-sensor-between-current-collectors configured to measure a current flowing in a communication path that connects two adjacent ones of the current collectors, and a processor configured to calculate a current flowing in each of the current collectors based on the currents measured by the supply current sensor and the current measured by the at least one current-sensor-between-current-collectors, and on a distribution ratio of the currents supplied to the main transformers, the distribution ratio being specified depending on a running pattern of the railroad vehicle. The at least one current-sensor-between-current-collectors is disposed at any position in every communication path.

Such configuration enables analysis of collected current in each current collector provided in a railroad vehicle comprising N current collectors by using measured value by one supply current sensor and measured value by N−1 current-sensors-between-current-collectors. Specifically, N current sensors in total allow analysis of the collected current. Also, measured values by the current sensors can be collected in a single analyzer (specifically, the processor) and analyzed. Consequently, the equipment cost can be reduced.

In one embodiment of the present disclosure, the processor may be configured to update the distribution ratio according to a change in the number of the main converters supplied with the currents. Such configuration enables continuing analysis of the collected current even when the running status of the railroad vehicle changes.

In one embodiment of the present disclosure, the at least one current-sensor-between-current-collectors may be disposed under a floor of a body of the railroad vehicle. Such configuration can reduce installation cost for the current-sensor-between-current-collectors.

BRIEF DESCRIPTION OF THE DRAWINGS

Some embodiments of the present disclosure will be described hereinafter by way of example with reference to the accompanying drawings, in which.

DETAILED DESCRIPTION OF EXEMPLARY EMBODIMENTS

1. First Embodiment

[1-1. Configuration]

Figure 1A:
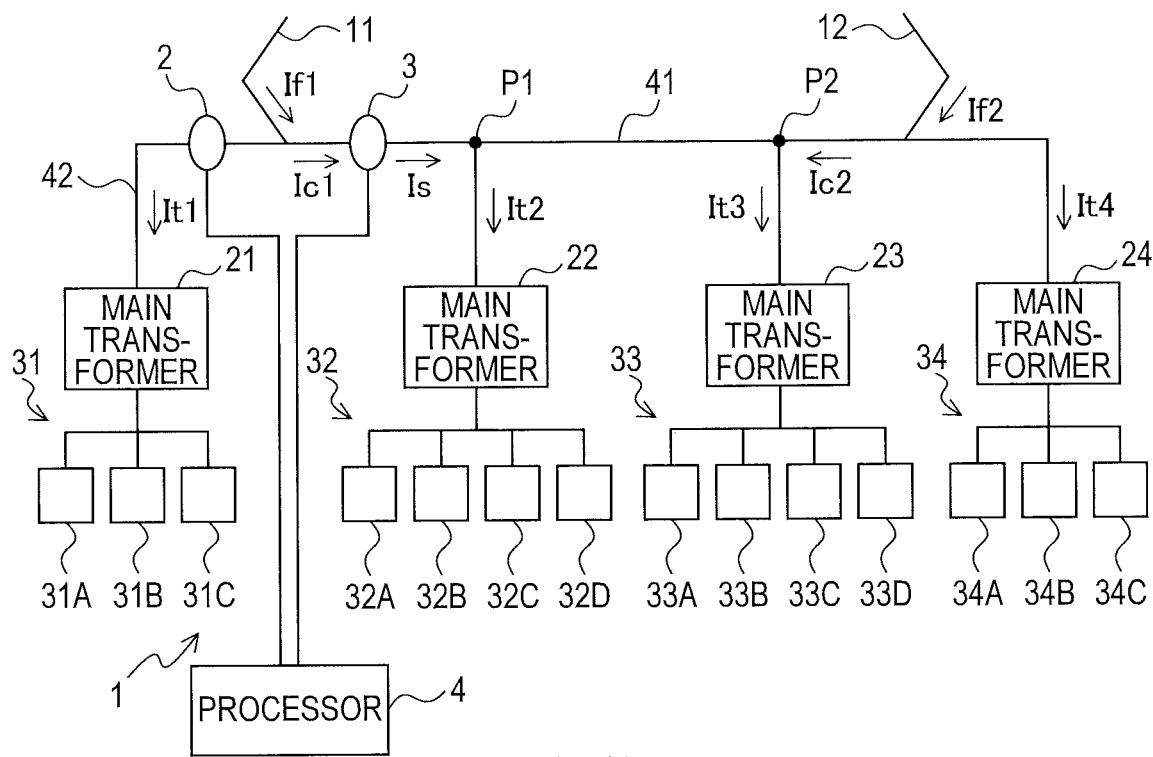
FIG. 1A is a block diagram schematically showing a configuration of a collected current monitoring device in the embodiments.

A collected current monitoring device 1 shown in FIG. 1A is installed in a railroad vehicle that comprises a first current collector 11, a second current collector 12, a first main transformer 21, a second main transformer 22, a third main transformer 23, a fourth main transformer 24, and main converters 31A to 31C, 32A to 32D, 33A to 33D, and 34A to 34C.

The main transformers 21, 22, 23, and 24 are connected in parallel to one another and are supplied with currents from the current collectors 11 and 12. In the present embodiment, the second main transformer 22 and the third main transformer 23 are connected to a communication path 41 that is an electric path connecting the first current collector 11 and the second current collector 12. The first main transformer 21 is connected to the first current collector 11 not via the communication path 41. The fourth main transformer 24 is connected to the second current collector 12 not via the communication path 41. The communication path 41 herein means a path directly connecting the current collectors and not including branching paths to the main transformers.

The main converters are each supplied with current from one corresponding main transformer. In the present embodiment, three main converters 31A, 31B, and 31C of a first group 31 are connected to the first main transformer 21, four main converters 32A, 32B, 32C, and 32D of a second group 32 are connected to the second main transformer 22, four main converters 33A, 33B, 33C, and 33D of a third group 33 are connected to the third main transformer 23, and three main converters 34A, 34B, and 34C of a fourth group 34 are connected to the fourth main transformer 24.

In a railroad vehicle, electric power supplied from the overhead contact line through the first current collector 11 and the second current collector 12, which are installed on the roof of a vehicle body, is transmitted to the main converters through the main transformers 21, 22, 23, and 24. The main converters supply electric power to main electric motors (not shown) to thereby enable running of the railroad vehicle.

The collected current monitoring device 1 analyzes collected current flowing in each of the first current collector 11 and the second current collector 12. The collected current monitoring device 1 comprises a supply current sensor 2, a current-sensor-between-current-collectors 3, and a processor 4.

<Current Sensor>

The supply current sensor 2 measures current supplied to a freely-selected main transformer among the main transformers 21, 22, 23, and 24.

In the present embodiment, the supply current sensor 2 measures current supplied to the first main transformer 21. The supply current sensor 2 is disposed in a current path 42 connecting the first current collector 11 and the first main transformer 21. The supply current sensor 2 is disposed under the floor of the vehicle body along with the first main transformer 21.

However, the supply current sensor 2 may measure current supplied to a main transformer other than the first main transformer 21. For example, the supply current sensor 2 may be disposed between the communication path 41 and the second main transformer 22 (specifically, between a branching point P1 and the second main transformer 22).

The current-sensor-between-current-collectors 3 is disposed at any position in the communication path 41 to measure current flowing in the communication path 41. In the present embodiment, the current-sensor-between-current-collectors 3 is disposed between the first current collector 11 and the branching point P1 to the second main transformer 22 (specifically, a position closer to the first current collector 11 than the branching point P1) in the communication path 41, and in an area located under the floor of the railroad vehicle body.

Disposing the current-sensor-between-current-collectors 3 under the floor of vehicle body can reduce installation cost for the current-sensor-between-current-collectors 3. However, the current-sensor-between-current-collectors 3 may be disposed in an area other than under the floor of vehicle body.

<Processor>

The processor 4 calculates respective currents flowing in the current collectors 11 and 12 based on a current measured by the supply current sensor 2, a current measured by the current-sensor-between-current-collectors 3, and on a distribution ratio of currents supplied to the main transformers 21, 22, 23, and 24. The distribution ratio is specified in accordance with a running pattern of the railroad vehicle.

The distribution ratio is determined depending on the numbers of main converters connected to the respective main transformers and magnitudes of the currents supplied to the respective main converters. When the first main transformer 21, the second main transformer 22, the third main transformer 23, and the fourth main transformer 24 have a distribution ratio of R1:R2:R3:R4, a current Itn flowing in the n-th main transformer is represented by Formulas 1 and 2, where If is a sum of the collected currents in the first current collector 11 and the second current collector 12. In the present embodiment, n=1, 2, 3, or 4.

$$Itn = Cn \times If$$ Formula 1:

$$Cn = Rn/\Sigma Rn$$ Formula 2:

For example, during power running, current is equally supplied to each of the main converters. Thus, in the present embodiment, the distribution ratio is determined depending on the numbers of the main converters connected to the respective main transformers. Specifically, in the present embodiment, the distribution ratio of the first main transformer 21 to the second main transformer 22 to the third main transformer 23 to the fourth main transformer 24 during power running is 3:4:4:3. Consequently, the first main transformer 21 is supplied with a current It1 of three-fourteenths the magnitude of If.

Accordingly, during power running, a coefficient Cn of Formula 1 is represented by Formula 3, where the number of main converters connected to the n-th main transformer is Mn, and the total number of main converters in the railroad vehicle is M0.

$$Cn = Mn/M0$$ Formula 3:

The processor 4 appropriately updates the distribution ratio of currents of the main transformers (specifically, the coefficient Cn) by referring to a table for the distribution ratio corresponding to a specified running pattern, for example, when the railroad vehicle performs braking during power running.

The processor 4 also updates the distribution ratio according to a change in the number of the main converters supplied with the currents. For example, in case a wheel slips or slides, the current supply to the main converter corresponding to the wheel is shut off.

During this period of time, the processor 4 detects a change in the number of main converters receiving current through an information transmission network in the railroad vehicle. The processor 4 updates the right side of either Formula 2 or Formula 3 based on detected information and corrects the coefficient Cn.

Hereafter, a specific procedure for calculating current flowing in each current collector performed by the processor 4 will be described.

First, the value of the sum of the collected currents If is calculated from the current It1 flowing in the first main transformer, which is measured by the supply current sensor 2, and Formula 1. Then, the current Itn (n=2, 3, 4) flowing in each of unmeasured major transformers is calculated from the obtained value of the sum of the collected currents If and Formula 1.

Second, a current Icm which is supplied from the m-th current collector to the communication path 41 is calculated from each current $Itn$, which flows in at least one of the main transformers connected to the communication path 41, and a current $Is$, which is measured by the current-sensor-between-current-collectors 3. In the present embodiment, m is 1 or 2.

In the present embodiment, the current-sensor-between-current-collectors 3 directly measures a current $Ic1$ that is supplied from the first current collector 11 to the communication path 41. Thus, Formula 4 is satisfied. A current $Ic2$ that is supplied from the second current collector 12 to the communication path 41 is calculated by using Formula 5.

$$Ic1=Is \qquad \text{Formula 4:}$$

$$Ic2=It2+It3-Is \qquad \text{Formula 5:}$$

By using the current $Icm$ and Formulas 6 and 7, collected current $If1$ in the first current collector 11 and collected current $If2$ in the second current collector 12 are calculated.

$$If1=It1+Ic1 \qquad \text{Formula 6:}$$

$$If2=It4+Ic2 \qquad \text{Formula 7:}$$

The collected current $If2$ in the second current collector 12 may be calculated by Formula 8. When using Formula 8, it is unnecessary to calculate the current $Ic2$ by using Formula 5.

$$If2=If-If1 \qquad \text{Formula 8:}$$

By following the abovementioned procedures, the processor 4 calculates the collected current $If1$ in the first current collector 11 and the collected current $If2$ in the second current collector 12. The collected currents $If1$ and $If2$ calculated by the processor 4 are provided for display by a displayer, recording on a recorder, determination on error warning, and other purposes.

Figure 1B:
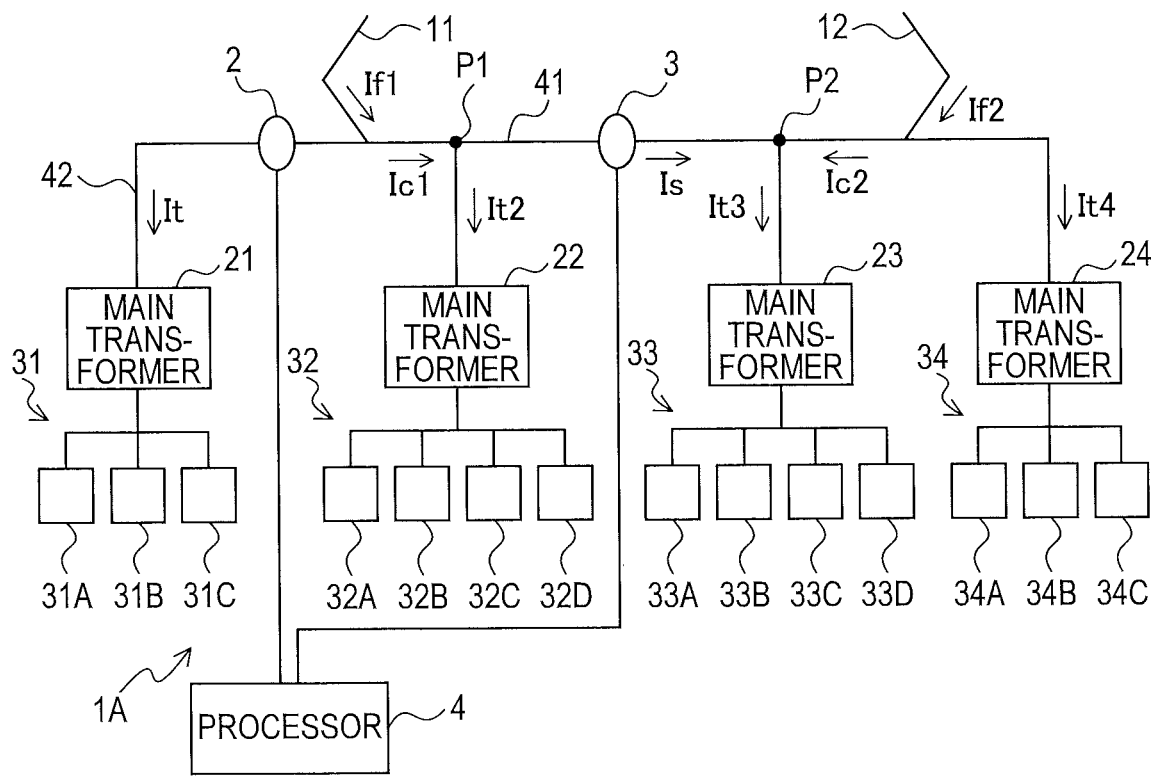
FIG. 1B is a block diagram schematically showing a configuration of a collected current monitoring device in the embodiments different from FIG. 1A.

While in the collected current monitoring device 1 in FIG. 1A, the current-sensor-between-current-collectors 3 is disposed between the first current collector 11 and the branching point P1 to the second main transformer 22, the current-sensor-between-current-collectors 3 may be disposed, as the collected current monitoring device 1A shown in FIG. 1B, between the branching point P1 to the second main transformer 22 and a branching point P2 to the third main transformer 23 in the communication path 41.

The current-sensor-between-current-collectors 3 in the collected current monitoring device 1A measures current $Is$ flowing from the branching point P1 toward the branching point P2, or from the branching point P2 toward the branching point P1. The current $Is$ is defined as being positive when the current flows from the branching point P1 toward the branching point P2, and being negative when the current flows from the branching point P2 toward the branching point P1.

In the collected current monitoring device 1A, the current $Ic1$ supplied from the first current collector 11 to the communication path 41 is obtained by using Formula 9, and the current $Ic2$ supplied from the second current collector 12 to the communication path 41 is obtained by using Formula 10.

$$Ic1=It2+Is \qquad \text{Formula 9:}$$

$$Ic2=It3-Is \qquad \text{Formula 10:}$$

From the current $Icm$ obtained by Formulas 9 and 10, and from Formulas 6 and 7, the collected current $If1$ in the first current collector 11 and the collected current $If2$ in the second current collector 12 are calculated.

[1-2. Effects]

According to the above-detailed first embodiment, the following effects can be obtained.

(1a) In a railroad vehicle comprising N current collectors, from a measured value by one supply current sensor 2 and measured values by N−1 current-sensors-between-current-collectors 3, collected current in each current collector can be analyzed. Specifically, N current sensors in total enable an analysis of the collected current. Also, measured values by the current sensors can be collected in a single analyzer (specifically, processor 4) and analyzed. Consequently, the equipment cost can be reduced.

(1b) The processor 4 updates the distribution ratio of current supplied to each of the main transformers when the number of main converters receiving current changes, to thereby enable continuing analysis of the collected current even when the running status of the railroad vehicle changes.

2. Second Embodiment

[2-1. Configuration]

Figure 2:
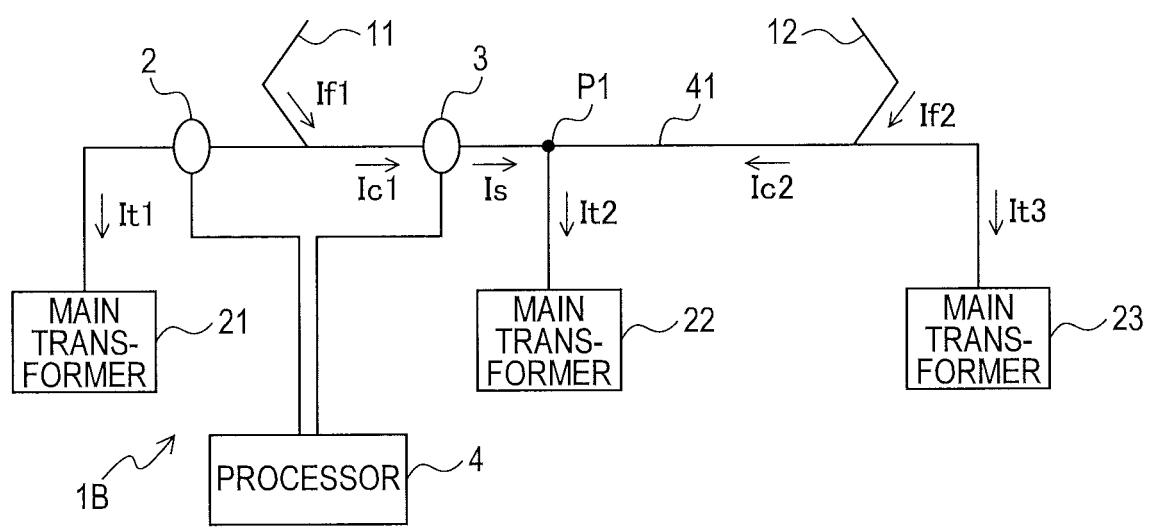
FIG. 2 is a block diagram schematically showing a configuration of a collected current monitoring device in the embodiments different from FIGS. 1A and 1B.

A collected current monitoring device 1B shown in FIG. 2 is installed in a railroad vehicle comprising the first current collector 11, the second current collector 12, the first main transformer 21, the second main transformer 22, the third main transformer 23, and main converters (not shown).

The railroad vehicle in which the collected current monitoring device 1B is installed comprises main transformers connected to the communication path 41 fewer by one than the railroad vehicle in which the collected current monitoring device 1 in FIG. 1A is installed.

The collected current monitoring device 1B comprises the supply current sensor 2, the current-sensor-between-current-collectors 3, and the processor 4. The current supply sensor 2, the current-sensor-between-current-collectors 3, and the processor 4 therein are the same as those in the collected current monitoring device 1 in FIG. 1A.

In the collected current monitoring device 1B, the processor 4 calculates respective currents flowing in the first current collector 11 and the second current collector 12 by following the same procedure as in the collected current monitoring device 1 in FIG. 1A. Specifically, by substituting zero for $It3$ in Formula 5, and replacing $It4$ with $It3$ in Formula 7, the collected current $If1$ in the first current collector 11 and the collected current $If2$ in the second current collector 12 are calculated.

[2-2. Effects]

According to the above-detailed second embodiment, the following effects can be obtained.

(2a) Even with one main transformer connected to the communication path 41, it is possible to analyze collected current in each current collector using the measured value by the supply current sensor 2 and the measured value by the current-sensor-between-current-collectors 3.

3. Third Embodiment

[3-1. Configuration]

Figure 3:
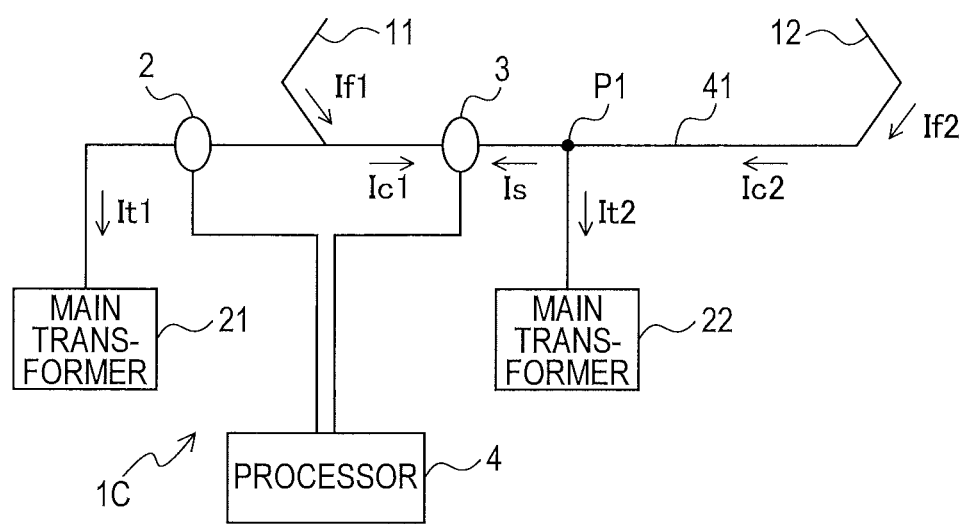
FIG. 3 is a block diagram schematically showing a configuration of a collected current monitoring device in the different embodiments from FIGS. 1A, 1B, and 2.

A collected current monitoring device 1C shown in FIG. 3 is installed in a railroad vehicle comprising the first current collector 11, the second current collector 12, the first main transformer 21, the second main transformer 22, and main converters (not shown).

The railroad vehicle in which the collected current monitoring device 1C is installed is configured by removing the main transformer connected to the second current collector 12 not via the communication path 41 from the railroad vehicle where the collected current monitoring device 1B in FIG. 2 is installed.

The collected current monitoring device 1C comprises one supply current sensor 2, one current-sensor-between-current-collectors 3, and the processor 4. The supply current sensor 2, the current-sensor-between-current-collectors 3, and the processor 4 are the same as those in the collected current monitoring device 1 in FIG. 1A.

In the collected current monitoring device 1C, the processor 4 calculates respective currents flowing in the first current collector 11 and the second current collector 12 by following the same procedure as in the collected current monitoring device 1 in FIG. 1. Specifically, by substituting zero for It3 in Formula 5 and It4 in Formula 7, the collected current If1 in the first current collector 11 and the collected current If2 in the second current collector 12 are calculated.

The current-sensor-between-current-collectors 3 may be disposed between the second current collector 12 and the branching point P1 to the second main transformer 22 in the communication path 41. In this case, the current Icm can be obtained by using Formulas 11 and 12 instead of Formulas 4 and 5. In Formulas 11 and 12, the current Is is defined as being positive when the current flows from the second current collector 12 toward the branching point P1, and being negative when the current flows from the branching point P1 toward the second current collector 12.

$Ic1=It2-Is$  Formula 11:

$Ic2=Is$  Formula 12:

[3-2. Effects]

According to the above-detailed third embodiment, the following effects can be obtained.

(3a) Even when the current collectors are provided in the same number as the main transformers, the collected current in each of the current collectors can be analyzed using the measured value by the supply current sensor 2 and the measured value by the current-sensor-between-current-collectors 3.

4. Fourth Embodiment

[4-1. Configuration]

Figure 4:
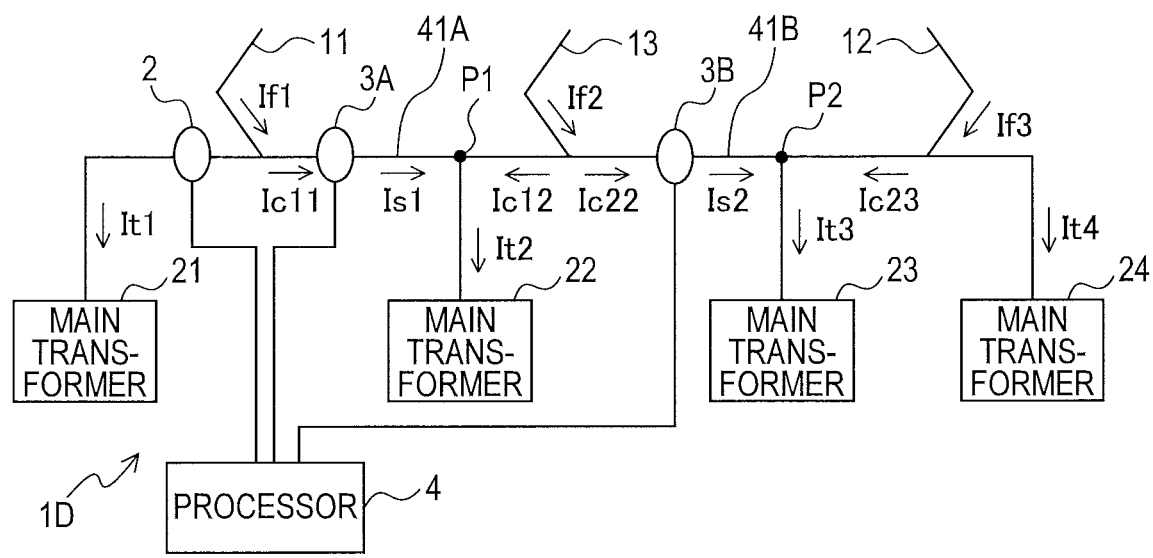
FIG. 4 is a block diagram schematically showing a configuration of a collected current monitoring device in the different embodiments from FIGS. 1A, 1B, 2, and 3.
Figure 5:
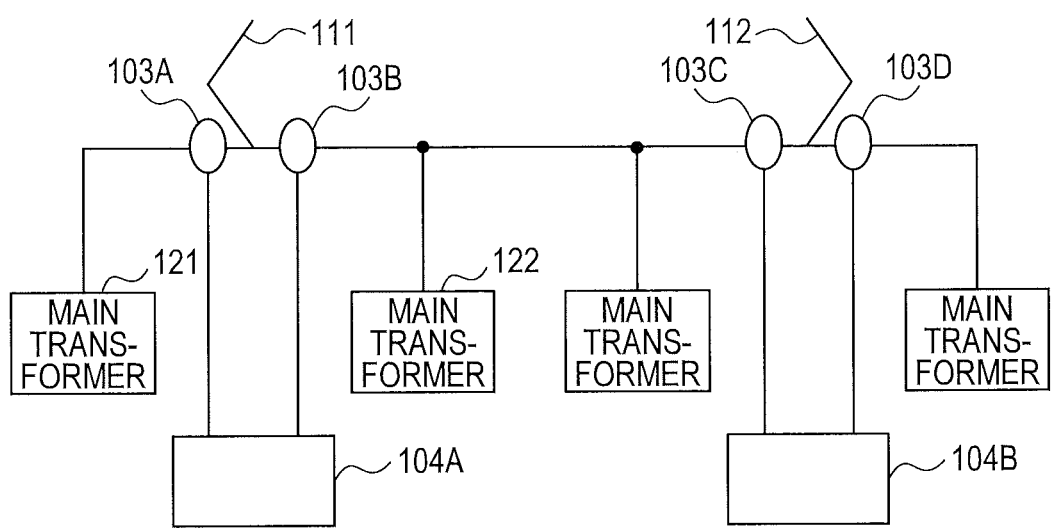
FIG. 5 is a block diagram schematically showing a configuration of a conventional collected current monitoring device.

A collected current monitoring device 1D shown in FIG. 4 is installed in a railroad vehicle comprising the first current collector 11, the second current collector 12, a third current collector 13, the first main transformer 21, the second main transformer 22, the third main transformer 23, the fourth main transformer 24, and main converters (not shown).

The railroad vehicle in which the collected current monitoring device 1D is installed additionally comprises the third current collector 13, which is connected between the second main transformer 22 and the third main transformer 23 in the railroad vehicle where the collected current monitoring device 1 in FIG. 1A is installed.

The collected current monitoring device 1D comprises one supply current sensor 2, a first current-sensor-between-current-collectors 3A, a second current-sensor-between-current-collectors 3B, and the processor 4. The supply current sensor 2 and the processor 4 are the same as those in the collected current monitoring device 1 in FIG. 1A.

The first current-sensor-between-current-collectors 3A is disposed between the first current collector 11 and the branching point P1 to the second main transformer 22, in a first communication path 41A, which is an electric path connecting the first current collector 11 and the second current collector 12.

The second current-sensor-between-current-collectors 3B is disposed between the second current collector 12 and the branching point P2 toward the third main transformer 23 in a second communication path 41B, which is an electric path connecting the second current collector 12 and the third current collector 13.

In the collected current monitoring device 1D, a current $Ic1m$ supplied from an m-th current collector to the first communication path 41A and a current $Ic2m$ supplied from the m-th current collector to the second communication path 41B are calculated from the current Itn flowing in each main transformer and obtained by following the same procedure as in the collected current monitoring device 1 in FIG. 1A, current Is1 measured by the first current-sensor-between-current-collectors 3A, current Is2 measured by the second current-sensor-between-current-collectors 3B, and Formulas 13, 14, 15, and 16. Herein, each of the currents Is1 and Is2 is defined as being positive when the current flows from the branching point P1 toward the branching point P2, and being negative when the current flows from the branching point P2 toward the branching point P1.

$Ic11=Is1$  Formula 13:

$Ic12=It2-Is1$  Formula 14:

$Ic22=Is2$  Formula 15:

$Ic23=It3-Is2$  Formula 16:

The collected current If1 in the first current collector 11, the collected current If2 in the second current collector 12, and collected current If3 in the third current collector 13 are respectively calculated from the currents $Ic1m$ and $Ic2m$ obtained by using Formulas 13, 14, 15, and 16, and from Formulas 17, 18, and 19.

$If1=It1+Ic11$  Formula 17:

$If2=Ic12+Ic22$  Formula 18:

$If3=It4+Ic23$  Formula 19:

The collected current If3 in the third current collector 13 may be calculated from Formula 20. When using Formula 20, it is unnecessary to calculate Ic23 by using Formula 16.

$If3=If-(If1+If2)$  Formula 20:

The first current-sensor-between-current-collectors 3A may be disposed between the second current collector 12 and the branching point P1 to the second main transformer 22, in the first communication path 41A. The second current-sensor-between-current-collectors 3B may be disposed between the third current collector 13 and the branching point P2 toward the third main transformer 23, in the second communication path 41B. In either case, the currents $Ic1m$ and $Ic2m$ can be obtained by appropriately changing Formulas 13, 14, 15 and 16.

[4-2. Effects]

According to the above-detailed fourth embodiment, the following effects can be obtained.

(4a) The collected current in each current collector can be analyzed using the measured value by the supply current sensor 2 and the measured values by the current-sensors-between-current-collectors 3A and 3B in a railroad vehicle comprising three or more main transformers (in other words, comprising two or more communication paths 41).

5. Other Embodiments

It is to be understood that although some embodiments of the present disclosure have been described above, the present disclosure is not limited to the aforementioned embodiments, but may be implemented in various forms.

(5a) The respective numbers of current collectors, main transformers and main converters provided in each of the railroad vehicles in the aforementioned embodiments are just examples. The numbers of these devices can be changed to any numbers, and the present disclosure is applicable to any railroad vehicle with two or more current collectors.

(5b) A function performed by a single element in the aforementioned embodiments may be achieved by a plurality of elements, or a function performed by a plurality of elements may be achieved by a single element. Also, a part of a configuration in the aforementioned embodiments may be omitted. Further, at least a part of a configuration in one of the aforementioned embodiments may be added to, or may be replaced with, a configuration in another one of the aforementioned embodiments. Any form included in the technical idea defined by the language of the appended claims may be an embodiment of the present disclosure.

What is claimed is:

1. A collected current monitoring device installed in a railroad vehicle,
    wherein the railroad vehicle comprises current collectors, main transformers connected in parallel to one another and supplied with currents from the current collectors, and main converters supplied with currents from the main transformers, the collected current monitoring device comprising:
    a supply current sensor configured to measure a current supplied to a freely-selected main transformer among the main transformers;
    at least one current-sensor-between-current-collectors configured to measure a current flowing in a communication path that connects two adjacent ones of the current collectors; and
    a processor configured to calculate a current flowing in each of the current collectors based on the current measured by the supply current sensor and the current measured by the at least one current-sensor-between-current-collectors, and on a distribution ratio of the currents supplied to the main transformers, the distribution ratio being specified depending on a running pattern of the railroad vehicle,
    wherein the at least one current-sensor-between-current-collectors is disposed at any position in every communication path.

2. The collected current monitoring device according to claim 1,
    wherein the processor is configured to update the distribution ratio according to a change in the number of the main converters supplied with the currents.

3. The collected current monitoring device according to claim 1,
    wherein the at least one current-sensor-between-current-collectors is disposed under a floor of a body of the railroad vehicle.

* * * * *